(12) United States Patent
Dono et al.

(10) Patent No.: US 7,898,884 B2
(45) Date of Patent: Mar. 1, 2011

(54) SEMICONDUCTOR DEVICE AND TEST METHOD THEREFOR

(75) Inventors: Chiaki Dono, Tokyo (JP); Atsushi Fujikawa, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 163 days.

(21) Appl. No.: 12/292,432

(22) Filed: Nov. 19, 2008

(65) Prior Publication Data

US 2010/0090675 A1 Apr. 15, 2010

(30) Foreign Application Priority Data

Oct. 10, 2008 (JP) .............................. 2008-264140

(51) Int. Cl.
*G11C 7/00* (2006.01)
(52) U.S. Cl. ................... 365/201; 365/226; 365/230.06
(58) Field of Classification Search ................. 365/201, 365/226, 230.06, 230.08
See application file for complete search history.

(56) References Cited

U.S. PATENT DOCUMENTS 6,549,480 B2  4/2003  Hosogane et al.
7,606,102 B2 * 10/2009  Blodgett ................... 365/225.7
7,660,183 B2 *  2/2010  Ware et al. ............. 365/230.03
2001/0033195 A1 10/2001  Kanda et al.
2002/0024330 A1  2/2002  Hosogane et al.

FOREIGN PATENT DOCUMENTS

JP  2002-74996   3/2002
JP  2006-179175  7/2006

* cited by examiner

*Primary Examiner*—Gene N. Audong
(74) *Attorney, Agent, or Firm*—McGinn IP Law Group, PLLC

(57) ABSTRACT

Disclosed is a semiconductor device including internal power supply generating circuits for generating internal power supplies and data terminals via which data signals are output or input/output. The internal power supply monitor terminals are in common use with the data terminals. The semiconductor device also includes selection circuits for selecting, by a test control signal, whether or not output voltages of the internal power supply generating circuits are to be output to the data terminals.

20 Claims, 8 Drawing Sheets

SEMICONDUCTOR DEVICE AND TEST METHOD THEREFOR

REFERENCE TO RELATED APPLICATION

This application is based upon and claims the benefit of the priority of Japanese patent application No. 2008-264140 filed on Oct. 10, 2008, the disclosure of which is incorporated herein in its entirety by reference thereto.

FIELD OF THE INVENTION

This invention relates to a semiconductor device. More particularly, this invention relates to a semiconductor device that may be suitably subjected to parallel testing, and a test method for the semiconductor device.

DESCRIPTION OF RELATED ART

In a wafer testing in which a device under test is tested in a wafer state by a wafer prober and a test equipment, such as a memory tester or an LSI tester, parallel testing which simultaneously tests a plurality of devices under test is adopted to shorten the test time and to reduce the test cost. In such parallel testing of semiconductor memory devices or semiconductor devices having internal memories, addresses and commands are applied in common to devices under test simultaneously. On the other hand, data output from the devices under test are respectively supplied to the tester, via the prober, on the device-by-device basis. The respective output data are compared with expected value data on the tester, which then gives a pass/fail decision on each of devices. In similar manner, each internal power supply generated in each device is measured respectively on the device-by-device basis. That is, an address pad of each device is connected to a probe common to multiple devices under test simultaneously, whilst a command pad of each device is also connected to another probe common to the multiple devices under test simultaneously. An input/output pad (DQ pad) for the data signal and a pad for monitoring the power supply are connected to separate probes on respective devices under test simultaneously.

FIG. 8 illustrates a typical instance of a prober and the connection relationship of respective devices for a parallel test. Referring to FIG. 8, an N number of devices #1 to #N on a wafer are connected to a prober 20, as devices under test simultaneously. An address pad (ADD) and a command pad (COM) of each device are connected to a probe common to the devices #1 to #N to reduce the number of the probes. A plurality of pads for monitoring the internal power supplies are provided from one device to another. In the instance shown in FIG. 8, four dedicated pads for monitoring the internal power supplies are provided for each device, with each pad being exclusively used for monitoring the internal power supply. These four dedicated pads of the device under test are respectively connected to associated probes 30. In the device, as shown in FIG. 8, the four dedicated pads are connected respectively to outputs of power supply generating circuits that generate a boosted voltage (potential) VPP, a negative voltage (potential) VKK, a memory array power supply voltage (potential) VARY and a power supply voltage (potential) for peripheral circuits VPERI, respectively. The boosted potential VPP is used for driving word lines, the negative potential VKK is used as a potential of the word line at the time of non-selection of the word line, and the memory array power supply potential VARY is used as e.g. a sense amplifier power supply. Sharing a common DQ pad or a common pad for monitoring an internal power supply among a plurality of devices under test is not possible, because a pass/fail decision as well as voltage measurement is required from one device to another. In FIG. 8, ARY denotes a memory cell array, and ROW COL control denotes a row address/column address control circuit, such as a row decoder, a column decoder and a sense amplifier. An input and output buffer (I/O buffer) connected to DQ pads is an input/output circuit for data signals (input buffer+output buffer). An ADD, COM control is a control circuit inclusive of an address register, a command decoder and a mode register.

Thus, a variety of internal power supply voltages are used within a semiconductor device, as shown in FIG. 8, such that it is difficult to reduce the number of pads for monitoring internal power supplies that are used for measuring the internal power supplies during the test.

In Patent Document 1, there is disclosed a semiconductor integrated circuit which allows for monitoring the internal voltages and for forced setting thereof from outside with the necessary minimum number of pin terminals without increasing the number of external pin terminals. In Patent Document 2, there is disclosed a semiconductor integrated circuit which may enable the output voltage status of the internal power supply circuits to be monitored from an external terminal to allow easy trimming of the internal voltage.

[Patent Document 1] JP Patent Kokai JP-A-2002-074996
[Patent Document 2] JP Patent Kokai JP-A-2006-179175

SUMMARY OF THE DISCLOSURE

The entire disclosures in the above-mentioned Patent Documents are incorporated herein by reference thereto. The following is an analysis given by the present invention. A semiconductor device is provided with a plurality of dedicated pads for monitoring each internal power supply, as described above. In a parallel wafer testing, probing is carried out in parallel, from dedicated pads for monitoring internal power supplies of devices under test in order to measure the respective internal power supply voltages to adjust the internal power supply voltages (trimming). This makes it difficult to reduce the number of the pads used for monitoring the internal power supplies. There is an upper limit to the number of the probes of the prober. The fact that it is difficult to reduce the number of the pads used for monitoring internal power supplies means that it is difficult to increase the number of devices that can be tested in parallel.

The invention disclosed in the present invention may be summarized substantially as follows:

In accordance with the present invention, there is provided a semiconductor device having a terminal for monitoring an internal power supply which is used in common with a signal terminal via which a signal is output or a signal is input and output. The semiconductor device includes a selection circuit which, responsive to a test control signal, selects whether or not an internal power supply voltage from an internal power supply generating circuit is to be output from the signal terminal. When the internal power supply voltage is output from the signal terminal, an output buffer that outputs a signal to the signal terminal is inactivated.

In accordance with the present invention, there is provided a method for testing a semiconductor device in which a terminal for monitoring an internal power supply is in common use with a signal terminal, via which data is output or data is input and output, and in which it is selected whether or not an internal power supply voltage is to be output to the signal terminal in response to a test control signal, wherein the method comprises:

setting the test control signal to a mode of outputting the internal power supply voltage from the signal terminal; and measuring the voltage of the internal power supply voltage output from the signal terminal of the semiconductor device.

According to the present invention, in which the terminals that monitor the internal power supplies in the device are in common use with signal terminals of the device, it is unnecessary to provide dedicated terminals that monitor the internal power supplies to render it possible to increase the number of the devices that may be tested in parallel.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES OF THE INVENTION

Exemplary embodiments of the present invention will now be described with reference to the drawings. In a parallel wafer test, a large number of signals are applied common to a plurality of devices under test. Data terminals (DQ pads) are independent to each other on each of the devices in order to make pass/fail decisions for output data signals from the respective data terminals. That is, the signals of the multiple data terminals are taken out separately from one device to another. In the device according to the present invention, the terminal (pad) for monitoring an internal power supply is in common use with the data terminal (DQ pad). There are provided selection circuits (100 to 103), each selecting which of the internal power supply voltage and the data signal is output from the data terminal (DQ pad). Selection by the selection circuit is controlled by a test control signal that controls the test mode.

According to the present invention, the terminals for monitoring the internal power supplies are in common use with the data terminals (DQ pads) to dispense with dedicated terminals (pad) used for simultaneously measurement of the internal power supplies of the devices under test in a parallel test. This decreases the number of probes per device, while increasing the number of devices that can be tested in parallel. That is, according to the present invention, the internal power supplies of the multiple devices may be measured simultaneously, in a parallel test, without increasing the number of the terminals (pads) of each device. The result is that, according to the present invention, the number of the devices that can be tested simultaneously may be increased to shorten the wafer test time as well as to reduce the test cost.

Figure 1:
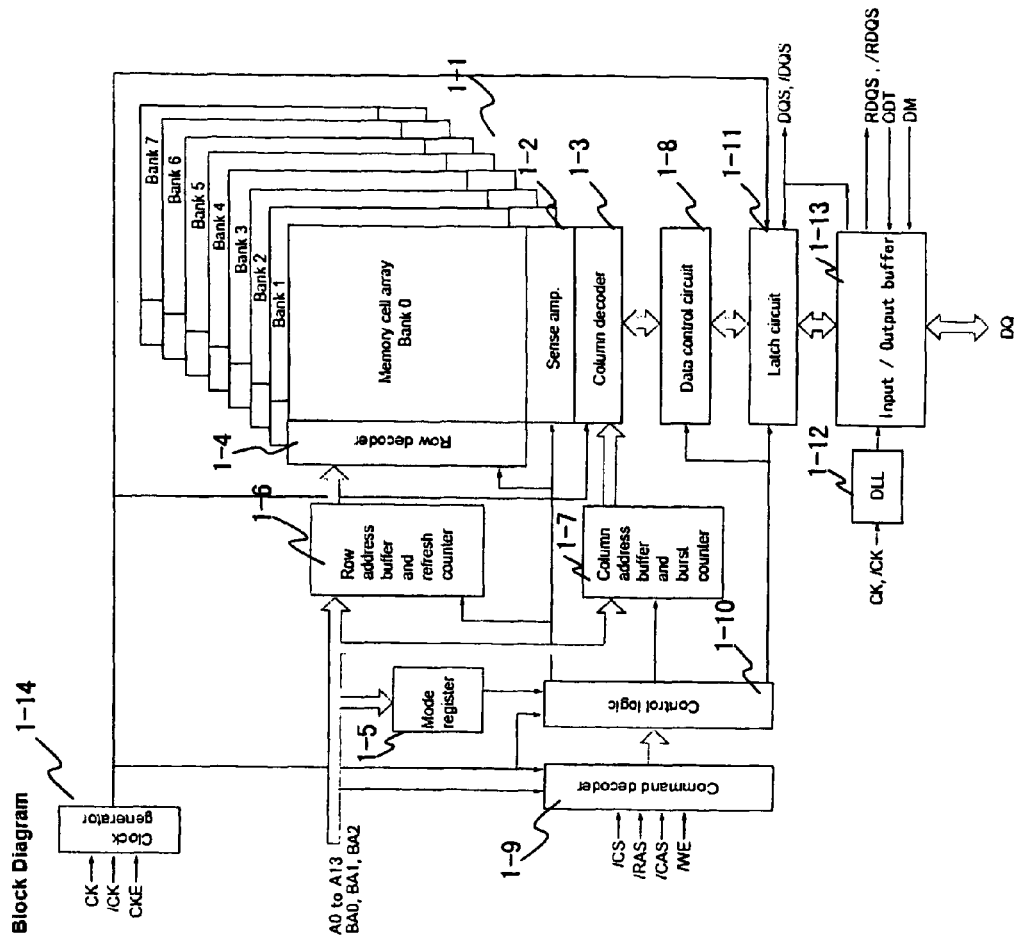
FIG. 1 is a schematic circuit diagram for illustrating the configuration of an example of the present invention.

FIG. 1 depicts a schematic block diagram showing the configuration of a DRAM device according to an example of the present invention. The DRAM device, shown in FIG. 1, is an SDRAM (Synchronous DRAM) of the DDR (Double Data Rate) configuration, and includes eight memory banks. The DDR configuration means the configuration of performing data transfer in synchronization with both rising and falling edges of the clock. In FIG. 1, a row decoder 1-4 decodes a row address to drive a selected word line, not shown. A sense amplifier 1-2 amplifies data read to a bit line, not shown, of a memory cell array 1-1. During a refresh operation, the sense amplifier 1-2 amplifies cell data read to a bit line which is connected to the cell of the word line, as selected by a refresh address, to write back the so amplified cell data in the cell. A column decoder 1-3 decodes a column address and turns on a selected Y-switch, not shown, to select a bit line to connect the bit line to an I/O line, not shown. A command decoder 1-9 receives a preset address signal, as input, while receiving control signals, that is, a chip select signal /CS, a row address strobe signal /RAS, a column address strobe signal /CAS and a write enable signal /WE, as inputs, to decode a command. A slash mark "/" preceding a signal name indicates that the signal is Low active. A column address buffer/burst counter 1-7 operates under control by a control logic 1-10, which receives a control signal from the command decoder 1-9, to generate addresses, the number of which corresponds to a burst length, from the input column address, to deliver the so generated address to the column decoder 1-3.

A mode register 1-5 is used for storage of the information that controls the operation mode of the SDRAM. By setting /CS, /RAS, /CAS, /WE, BA0, BA1 and BA2 to Low, and by setting respective bits of the addresses A0 to A13 to preset values, by an MRS (Mode Register Set) command, the /CAS latency, burst length, burst type or the test mode, for instance, may be set in the mode register 1-5. It is noted that a clock enable signal CKE needs to be set to HIGH and all banks need to be precharged by a PALL (Precharge ALL) command before writing in the mode register 1-5. Although the mode register 1-5 is set by the MRS command in a power-up sequence, the contents of the mode register 1-5 may be rewritten by the MRS command as long as all of the banks remain precharged in the normal mode. The mode register 1-5 outputs a control signal to the control logic 1-10. The mode register 1-5 includes an EMR (Extended Mode Register), EMR(2) or EMR(3), respectively set by an EMRS (Extended Mode Register Set), though it is not intended to limit the present invention to such configuration. The EMRS, EMRS(2) and EMRS(3) may be set by setting /CS, /RAS, /CAS and /WE to Low. The EMRS may then be set by setting BA0 to high and setting BA1 and BA2 to Low. The EMR(2) may be set by setting BA1 to high and setting BA0 and BA2 to Low and the EMR(3) may be set by setting BA2 to High, setting BA0 and BA1 to Low. The respective bits of the address A0 to A13 need to be set to preset values.

In case the address bit A12, for example, in the EMRS command, is set to 1, the output buffer disable information is written in the EMR. In case the address bit A12 is 0, the output buffer is set to an enabled state. When disabled, the output buffer is set to an off state, with the output being in a high impedance state. The EMR may be rewritten by the EMRS command as long as all of the banks are in a precharged state.

A row address buffer of a row address/buffer refresh counter 1-6 receives an input row address to output it to the row decoder 1-4, while its refresh counter receives a refresh command to perform a count-up operation to deliver a count output as a refresh address. The row address from the row address buffer and the refresh address from the refresh counter are delivered to a multiplexer, not shown. During a refresh operation, the refresh address is selected. During the time other than the refresh time, the row address from the row address buffer is selected and delivered to the row decoder 1-4.

A clock generator 1-14 receives an external clock CK and a complementary clock /CK, supplied to the DRAM device, and outputs an internal clock when a clock enable signal CKE is High. When subsequently the clock enable signal CKE goes Low, the clock supply is stopped.

A data control circuit 1-8 receives/outputs write data and read data. A latch circuit 1-11 latches the write data and read data. A DLL (Delay Lock Loop) 1-12 generates a signal synchronized with a delay with the external clocks CK and /CK to deliver the so generated signal to an input/output buffer 1-13. The data read from the memory cell array 1-1 is delivered from the latch circuit 1-11 to the input/output buffer 1-13. The input/output buffer 1-13 outputs read data from a set of data terminals DQ at a double data rate, using a rising edge and a falling edge of a clock signal synchronized with the external clock CK by the DLL 1-12. The data terminals DQ are I/O terminals that input/output data. The input/output buffer 1-13 receives/outputs data from and to the data terminals DQ. In the present example, certain ones of a plurality of data terminals that make up the set of data terminals DQ are also used as terminals for monitoring internal power supplies.

DM is a data mask signal for the write data. If, during writing, the data mask signal DM is High, the data is written. DQS and /DQS are differential data strobe signals that prescribe data write timing and data read timing, respectively. These DQS and /DQS signals are I/O signals for the input signal during the write operation and I/O signals for the output signal during the readout operation. RDQS and /RDQS are differential data strobe signals dedicated to the read operations. ODT (On Die Termination) is a control signal that turns terminal resistors of DQ, DQS, /DQS, RDQS and /RDQS on or off. FIG. 1 schematically depicts a typical example of a DRAM device and, of course, the present invention is not limited to this configuration.

Figure 2:
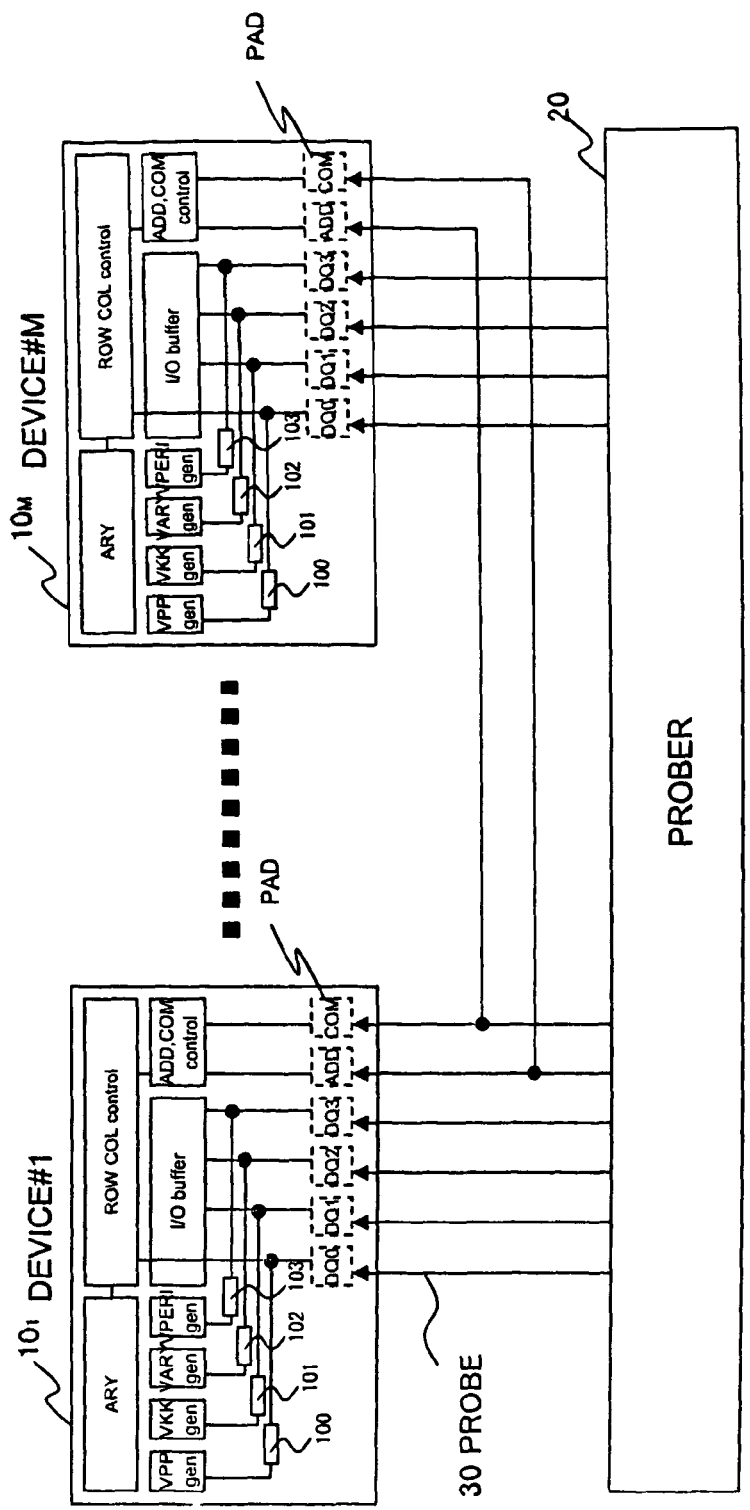
FIG. 2 is a schematic circuit diagram for illustrating the global configuration of a memory device according to the present invention.

FIG. 2 depicts a schematic block diagram showing an example of the present invention. Similarly to FIG. 8, described above, FIG. 2 shows the relationship of interconnection of a prober and a plurality of devices under test which are subjected to parallel testing (subjected to simultaneous testing) in a wafer test. Supposing that the prober 20 is the same as the prober 20 of FIG. 8, an M number of devices #1 to #M are connected as devices under test for parallel testing. Thus, the M number of devices can be tested simultaneously. It is noted that the number M of FIG. 2 is greater than the number N of FIG. 8.

In the present example, the devices #1 to #M of FIG. 2 are each the SDRAM of FIG. 1. The address (ADD) and the command (COM) are connected to respective common probes from one device to another. It is noted that, in FIG. 2, the address of FIG. 1 (the address signals A0 to A13, BA0, BA1 and BA2 of FIG. 1) are shown by a single pad and a single probe only for simplicity. The commands given by for example the control signals, such as /CS, /RAS, /CAS or /WE, are also shown by a single PAD and a single probe 30 only for simplicity.

In the SDRAM of FIG. 1, 32 DQ pads (DQ0 to DQ31) are provided for the case of 32 bit width data (4 byte data), for instance. However, only four of them (DQ0, DQ1, DQ2 and DQ3) are shown. In keeping therewith, four DQ pads (DQ0, DQ1, DQ2 and DQ3) are shown in FIG. 2, while the remaining DQ PADs, that is, DQ pads DQ4 to DQ31, not shown, are dedicated to input/output of data signals. For the case of 16 bit width data, four of 16 DQ pads (DQ0 to DQ15), are shown, whereas, for the case of 8 bit width data, four of 8 DQ pads (DQ0 to DQ7), are shown. In both of these cases, the remaining DQ pads (DQ4 to DQ15 or DQ4 to DQ7), are dedicated to input/output of data signals. With four bit width data, the DQ PADs DQ0 to DQ3 are all used as terminals for monitoring the internal power supplies as well.

Referring to FIG. 2, in the present example, a VPP power supply generating circuit (VPP gen), a VKK power supply generating circuit (VKK gen), a VARY power supply generating circuit (VARY gen) and a VPERI power supply generating circuit (VPERI gen) are connected via selection circuits 100, 101, 102 and 103 to associated DQ pads (DQ0, DQ1, DQ2 and DQ3), respectively. The selection circuits 100 to 103 convert the voltage levels to a CMOS level (CMOS amplitude) in keeping with the levels of the internal power supply voltages generated by the power supply generating circuits, and output the resulting signals from the corresponding DQ pads. The amplitudes of the signals at the DQ pads range from VSS (0V) to VDD (1.8V), only by way of illustration.

An I/O buffer is connected to the DQ pads (DQ0, DQ1, DQ2 and DQ3). The I/O buffer corresponds to the input/output buffer 1-13 of FIG. 1. In FIG. 2, a plurality of I/O buffers, associated with a plurality of DQ pads, are shown by a sole block.

Figure 8:
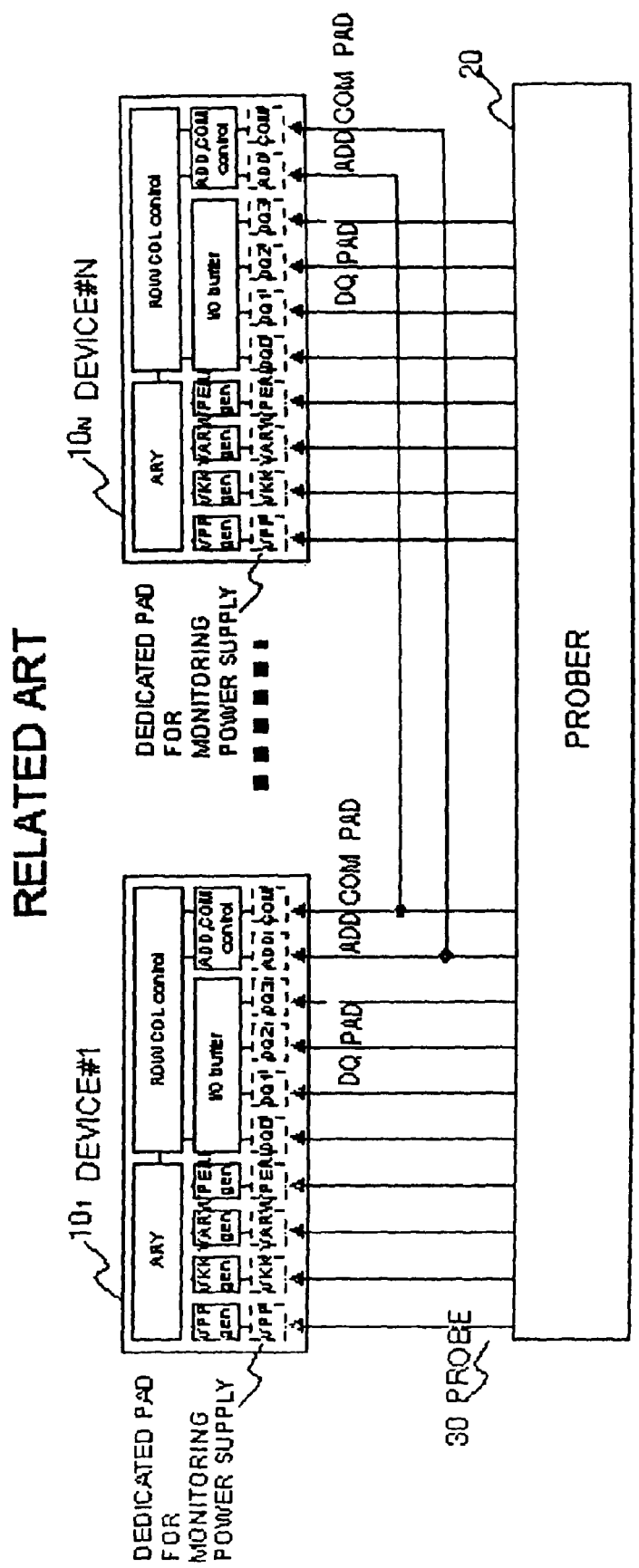
FIG. 8 is a schematic circuit diagram for illustrating the conventional parallel testing.

In the present example, the dedicated pads for monitoring the internal power supplies, such as those shown in FIG. 8, are not provided. With the number of probes of the prober remaining unchanged, the number of the probes in FIG. 2 may be smaller than that of FIG. 8, with the result that the number of the devices that can be measured at a time may be increased (M>N). Although FIG. 2 shows the configuration of four internal power supply generating circuits, it is to be noted that the number of the internal power supply generating circuits to be monitored in a parallel test may be larger or smaller than four, if desired.

The DQ pads are respectively connected to probes 30 on each device, and are individually tested by a tester. Hence, there is raised no problem in connection with parallel measurement of the internal power supply voltages. That is, in the present example, the power supply voltages, output in parallel to the DQ pads (DQ0 to DQ3) of the respective devices, are respectively supplied via the probes 30 and the prober 20 to voltage measurement circuits of the tester, not shown, for measurement in parallel. That is, in the example shown in FIG. 2, the tester, not shown, is assumed to have such a configuration that allows for simultaneous voltage measurement by at least 4×M-number of voltage measurement circuits.

In the present example, the circuit overhead of the selection circuits 100 to 103 is only small, as explained later in detail.

In monitoring the power supply voltages of the power supply generating circuits, the power supply voltages during the time the DQ PADs are not used, that is, during the time other than the read/write access time, may be measured by measuring the power supply voltages from the DQ pads (DQ0 to DQ3) as the selection circuits 100 to 103 are controlled by a test control signal, not shown. This test control signal which is produced by the control logic 1-10, based on a value set in the mode register 1-5 of FIG. 1, is supplied common to the selection circuits 100 to 103.

Figure 3:
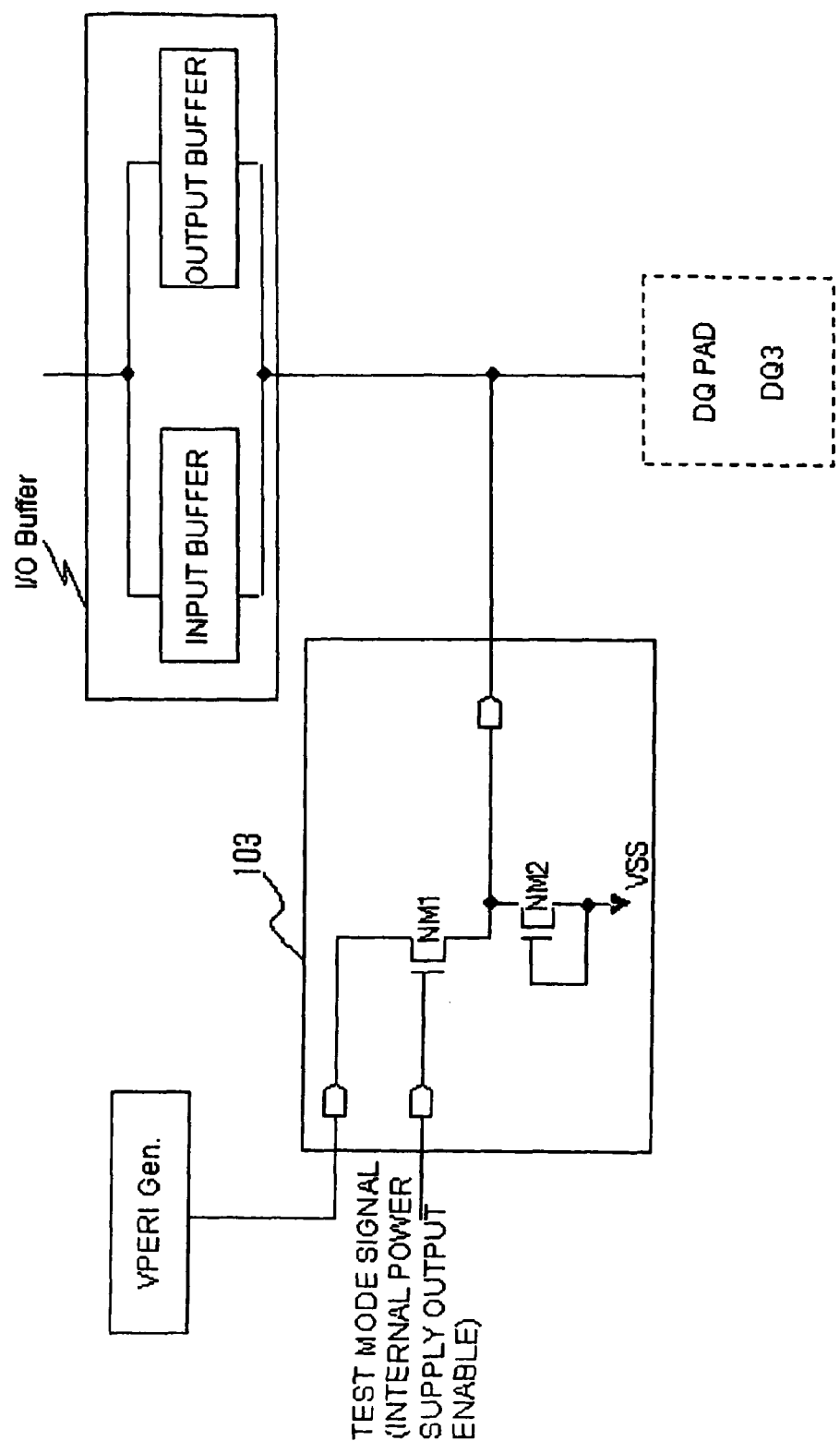
FIG. 3 is a schematic circuit diagram for illustrating a selection circuit of a configuration according the example of the present invention.

FIG. 3 shows an example of the configuration of the selection circuit 103 that receives an output voltage of the VPERI power supply generating circuit (VPERI gen) of FIG. 2. The potential VPERI is set to 1.35V (VPERI=1.35V), only by way of illustration. The configuration of the selection circuit 102 that receives an output voltage of the VARY power supply generating circuit (VARY gen) is set in a similar manner (VARY=1.2V).

Referring to FIG. 3, the selection circuit 103 includes an NMOS transistor NM1. A drain of the NMOS transistor is connected to an input terminal of the selection circuit 103, which is connected to an output of the VPERI power supply generating circuit (VPERI gen). A test mode signal (internal power supply output enable signal) is supplied to the gate of the NMOS transistor. A source of the NMOS transistor is connected to an output terminal of the selection circuit 103, which is connected to the DQ pad DQ3. Another NMOS transistor NM2 is connected between the output terminal of the selection circuit 103 and the power supply VSS. The NMOS transistor NM2 has a gate and a source connected in common to the power supply VSS, and operates as an input protection circuit. The NMOS transistor NM2 protects the internal voltage generating circuit (VPERI gen) against an input voltage from the DQ pad side. It should be noted that a plurality of NMOS transistors, the gates of which are supplied in common with the test mode signal (internal power supply voltage output enable signal), may be connected in parallel between the input terminal and the output terminal of the selection circuit 103 to enhance the current driving capability.

In the present example, the test mode signal (internal power supply voltage output enable signal) is such a signal obtained by setting the High level voltage of the test control signal, with the amplitude of VSS-VDD, output from the control logic 1-10 of FIG. 1, to the boosted voltage VPP. That is, the test mode signal has an amplitude of VSS-VPP, in which VPP stands for the boosted voltage.

If, in FIG. 3, the test mode signal is at the boosted voltage VPP (internal power supply output enabling state), the NMOS transistor NM1 is turned on. An output voltage of the VPERI power supply generating circuit (VPERI gen) is delivered to the DQ pad DQ3. If, on the other hand, the test mode signal (internal power supply voltage output enable signal) is at the voltage VSS, the NMOS transistor NM1 is turned off, so that an output voltage of the VPERI power supply generating circuit (VPERI gen) is not delivered. An input buffer and an output buffer together make up one of the I/O buffers shown in one block in FIG. 2.

If, in a wafer test, an output voltage of the VPERI power supply generating circuit (VPERI gen) is delivered from the DQ pad DQ3, the output buffer of the I/O buffer (I/O buffer) is set to a disabled state. This may be accomplished by EMR setting by the EMRS command for the mode register 1-5 of FIG. 1 (the address A12 in the EMRS command is set to 1). Thus, no collision of output data from the output buffer by read access occurs when an output voltage of the VPERI power supply generating circuit (VPERI gen) is delivered to the DQ pad DQ3. The potential VPERI, output to the DQ pad DQ3, is supplied by the probe 30 and by the prober 20 to a voltage measurement circuit of a tester, not shown, where the voltage value of VPERI is measured.

Write access may be made when an output voltage of the VPERI power supply generating circuit (VPERI gen) is delivered to the DQ pad DQ3. Since the CMOS level voltage to the DQ pad DQ3 is output from the selection circuit 103, the VPERI potential is applied to the input buffer. The VPERI potential (=1.35V) is captured as write (High) data.

Figure 4:
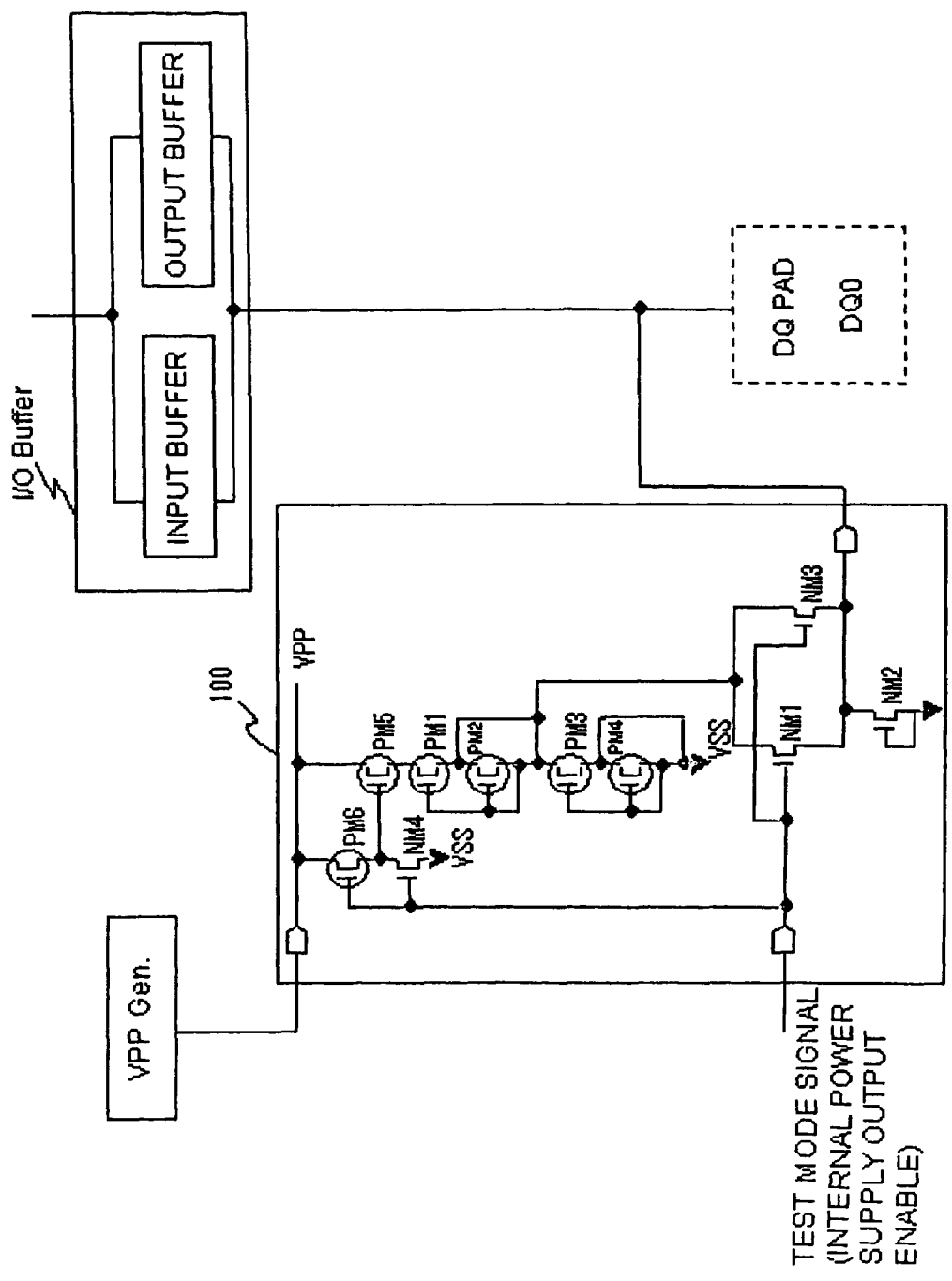
FIG. 4 is a schematic circuit diagram for illustrating another selection circuit of a configuration according the example of the present invention.

FIG. 4 illustrates the configuration of the selection circuit 100 that receives the boosted voltage VPP output from the VPP power supply generating circuit (VPP gen) of FIG. 2. With the present example, the boosted voltage VPP is set to 2.7V (VPP=2.7V), though not imposing any limitation to the present invention.

Referring to FIG. 4, the selection circuit 100 includes a PMOS transistor PM6, having a source connected to the boosted power supply voltage VPP (that is, to an output terminal of the VPP power supply generating circuit). The selection circuit also includes an NMOS transistor NM4, having a source connected to the power supply VSS (0V) and having a drain connected to a drain of the PMOS transistor PM6. The test mode signal (internal power supply output mode) is supplied in common to the gates of the NMOS transistor NM4 and the PMOS transistor PM6. The commonly coupled drains of the NMOS transistor NM4 and the PMOS transistor PM6 are connected to the gate of a PMOS transistor PM5 (switching transistor) having a source connected to the boosted power supply VPP. Between the drain of the PMOS transistor PM5 and the power supply VSS, there are provided four cascode connected PMOS transistors PM1, PM2, PM3 and PM4. The PMOS transistors PM1 and PM2 have gates connected in common and connected to the drain of the PMOS transistor PM2. The PMOS transistor PM1 has a drain connected in common to the drain of the PMOS transistor PM2. The PMOS transistors PM3 and PM4 have gates connected in common and connected to the drain of the PMOS transistor PM4. The PMOS transistor PM3 has a drain connected common to the drain of the PMOS transistor PM4 and connected to the power supply VSS.

In the present example, the PMOS transistors PM1 to PM4 are all of the same dimension and have the same on-resistance, though not imposing any limitation to the present invention. In case the gate potential of the PMOS transistor PM5 is the power supply potential VSS, and the PMOS transistor PM5 is on, the common connection node of the drains of the PMOS transistors PM2 and PM3 is a mid-point potential equal to VSS+(VPP−VSS)/2=VPP/2.

The selection circuit 100 further includes NMOS transistors NM1 and NM3, having drains connected to a common connection node of the drains of the PMOS transistors PM2 and PM3 and having sources connected to an output terminal (DQ pad DQ0) of the selection circuit 100. To the gates of the NMOS transistors NM1 and NM3 is supplied the test mode signal (internal power supply output mode signal). Between the output terminal of the selection circuit 100 and the power supply VSS, there is connected an NMOS transistor NM2 that has a gate and a source connected together and that operates as an input protection circuit. Of course, a single NMOS transistor may be used in place of the NMOS transistors NM1 and NM3.

The test mode signal (internal power supply voltage output enable signal) of FIG. 4 is the same as the test mode signal (internal power supply voltage output enable signal) of FIG. 3. When the test mode signal (internal power supply voltage output enable signal) is the boosted voltage VPP, the NMOS transistor NM4 is turned on. The gate potential of the PMOS transistor PM5 is then VSS to turn on the PMOS transistor PM5. The current then flows through the vertically stacked PMOS transistors PM1 to PM4. The potential of the common junction of the drains of the PMOS transistors PM2 and PM3 is equal to VPP/2. The NMOS transistors NM1 and NM3 are turned on and an output voltage VPP/2 of the VPP power supply generating circuit (VPP gen) is delivered from the output terminal of the selection circuit 100 to the DQ pad DQ0.

When the test mode signal (internal power supply voltage output enable signal) is equal to the power supply voltage VSS (0V), the NMOS transistor NM4 is turned off, and the PMOS transistor PM6 is turned on. Since the gate potential of the PMOS transistor PM5 is the boosted potential VPP, the PMOS transistor PM5 is turned off, so that no current of the power supply path of the PMOS transistor PM5 and the PMOS transistors PM1 to PM4 flows from the VPP towards the VSS. On the other hand, the NMOS transistors NM1 and NM3 are turned off so that the output voltage from the VPP power supply generating circuit (VPP gen) is not delivered from the output terminal of the selection circuit 100.

In FIG. 4, as in FIG. 3, the input buffer and the output buffer together make up one of I/O buffers that make up the block of the I/O buffer of FIG. 2.

When the test mode signal is at the boosted voltage VPP (internal power supply output enabling state), and one/half of the output voltage VPP of the VPP power supply generating circuit (VPP gen) is to be output from the DQ pad DQ0, an output buffer, as one of the buffers of the block of the I/O buffer, is in a disabled state. This is accomplished by setting the EMRS command to the mode register 1-5 of FIG. 1. There is thus no risk of collision of output data of the output buffer by read access when the voltage VPP/2 is output to the DQ pad Q0. The voltage VPP/2, output to the DQ pad Q0, is delivered via the probe 30 and the prober 20 to a voltage measurement circuit of a tester, not shown, for voltage measurement.

When the voltage VPP/2 is output to the DQ pad DQ0, in the present example, write access may be performed. Since the voltage of VPP/2 (=1.35V) is output to the DQ pad DQ0 from the selection circuit 100, VPP/2 is applied to the input buffer and captured as write data (High data).

Figure 5:
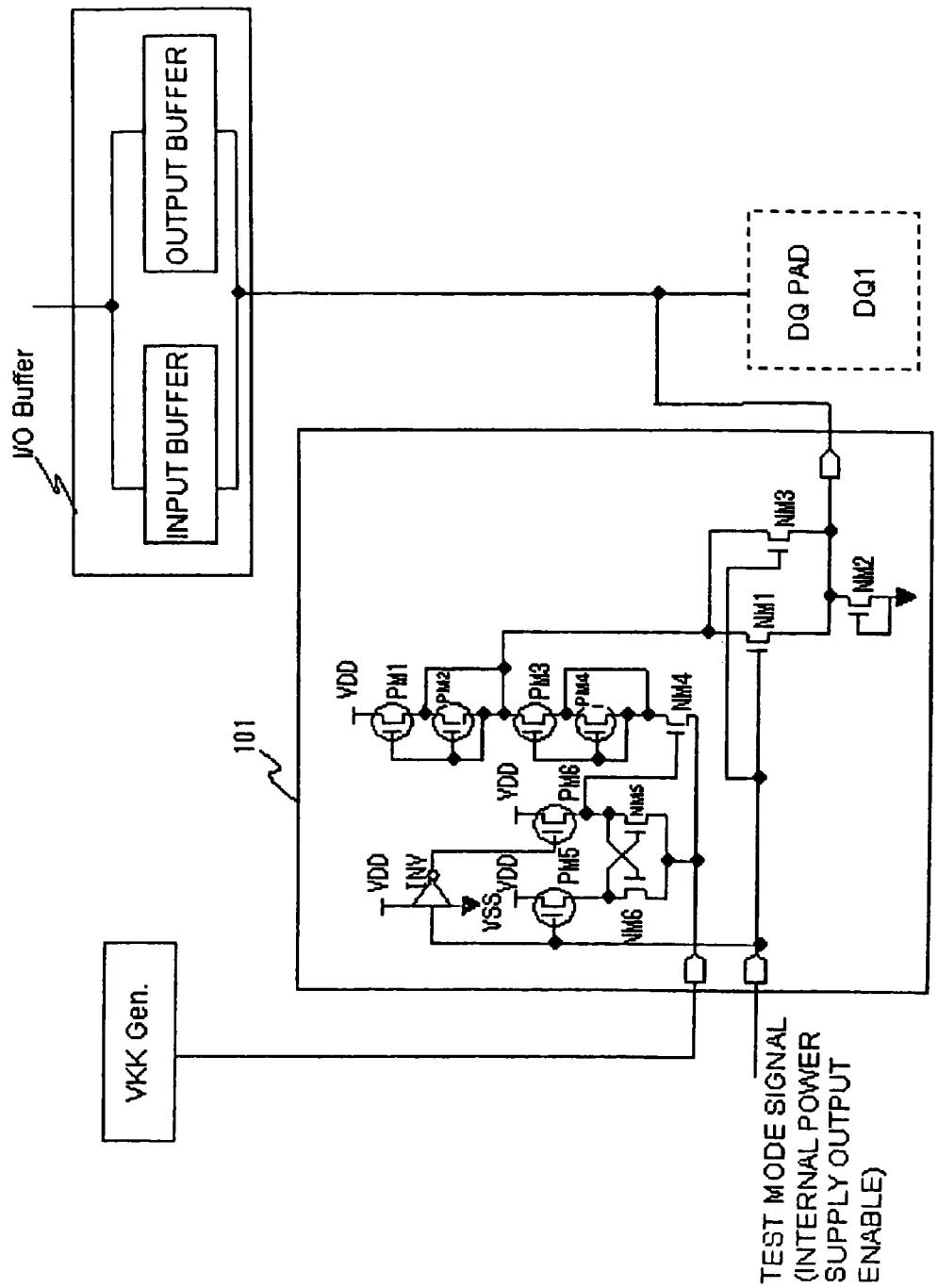
FIG. 5 is a schematic circuit diagram for illustrating yet another selection circuit of a configuration according the example of the present invention.

FIG. 5 illustrates the configuration of the selection circuit 101 that receives the negative voltage VKK output from the VKK power supply generating circuit (VKK gen). The negative voltage VKK is set to −0.4V, though not in a limiting way. The selection circuit of FIG. 5 may also be applied to a power supply monitor of VBB (back bias voltage). In this case, the DQ pad DQ4, not shown in FIG. 2, is used as a pad for monitoring the power supply of VBB (back bias voltage).

Referring to FIG. 5, the selection circuit 101 includes an inverter INV, NMOS transistors NM5 and NM6 and PMOS transistors PM5 and PM6. The inverter INV has, as driving power supplies, a power supply voltage VDD and a power supply voltage VSS, and receives a test mode signal (internal power supply output mode), with an amplitude of VPP, at its gate. The NMOS transistors NM5 and NM6 have sources connected in common to a terminal that receives the output voltage (VKK) of the VKK power supply generating circuit (VKK gen), and have gates and drains cross-coupled to each other. The PMOS transistors PM5 and PM6 are connected between the drains of the NMOS transistors NM5 and NM6 and the power supply VDD. The gate of the PMOS transistor PM5 is connected to a test mode signal (internal power supply output mode), while the gate of the PMOS transistor PM6 is connected to an output of the inverter INV. The selection circuit 101 further includes an NMOS transistor NM4 having a source connected to its terminal receiving an output voltage VKK of the VKK power supply generating circuit (VKK gen) and having a gate connected to the drain of the PMOS transistor PM6. Between the power supply VDD and the drain of the NMOS transistor NM4 are vertically stacked PMOS transistors PM1, PM2, PM3 and PM4. The gates of the PMOS transistors PM1 and PM2 are connected in common and connected to the drain of the PMOS transistor PM2. The drain of the PMOS transistor PM1 is connected to the drain of the PMOS transistor PM2. The gates of the PMOS transistors PM3 and PM4 are connected in common and connected to the drain of the PMOS transistor PM4. The drain of the PMOS transistor PM3 is connected to the drain of the PMOS transistor PM4 and to the drain of the NMOS transistor NM4.

The selection circuit 101 further includes NMOS transistors NM1 and NM3 that have drains connected to a common connection node of the drains of the PMOS transistors PM2 and PM3. The sources of the NMOS transistors NM1 and NM3 are connected to an output terminal of the selection circuit 101 connected in turn to the DQ pad DQ1. The gates of the NMOS transistors are supplied with the test mode signal having the amplitude of VDD (internal power supply output mode). Between the output terminal of the selection circuit 101 and the power supply VSS, there is connected an NMOS transistor NM2 having a gate and a source connected together and operating as an input protection circuit. The test mode signal (internal power supply output enable signal) is a signal having an amplitude equal to VSS−VPP, as in FIGS. 3 and 4.

The NMOS transistors NM1 and NM3 are turned on, when the test mode signal (internal power supply output enable signal) is at the voltage VPP. At this time, the output of the inverter INV is at Low level (power supply voltage VSS), so that the PMOS transistor PM6 is turned on, while the PMOS transistor PM5 is turned off. With the PMOS transistor PM6 on, the gate voltage of the NMOS transistor NM6 is the power supply voltage VDD. This turns the NMOS transistor NM6 on. The gate potential of the NMOS transistor NM5 is VSS so that the NMOS transistor NM5 is turned off. The gate voltage of the NMOS transistor NM4 is the power supply voltage VDD. This turns the NMOS transistor NM4 on so that the current flows from the VDD to the PMOS transistors PM1 to PM4. In the present example, the cascode connected PMOS transistors PM1 to PM4 are of the same dimension and have an equal on-resistance, though not in a limiting way. A voltage corresponding to VKK+(VDD−VKK)/2=(VDD+VKK)/2 is output from a common junction of the drains of the PMOS transistors PM2 and PM3. With VDD=1.8V and VKK=−0.4, (VDD+VKK)/2=0.7V.

The voltage (VDD+VKK)/2, output to the DQ pad DQ1, is delivered via the probe 30 and the prober 20 to a voltage measurement circuit of a tester, not shown, for voltage measurement. In the present example, write access may be performed when the voltage (VDD+VKK)/2 is applied to the DQ pad DQ1. Since the voltage (VDD+VKK)/2(=0.7V) is output to the DQ pad DQ1 from the selection circuit 101, the voltage (VDD+VKK)/2 is applied to the input buffer so as to be captured as write data (Low data).

On the other hand, if the test mode signal (internal power supply output enable) is at the voltage VSS, the PMOS transistor PM5 is turned on. An output of the inverter INV is the power supply voltage VDD, so that the PMS transistor PM6, receiving this voltage VDD at its gate, is turned off. The NMOS transistor NM5, the gate potential of which is the power supply voltage VDD, is turned on. The gate potential of the NMOS transistor NM4 is the negative potential VKK, as is its source potential, so that the NMOS transistor NM4 is turned off. The NMOS transistors NM1 and NM3 are also turned off.

In the example shown in FIG. 5, the NMOS transistors NM1 and NM3, controlled to be turned on/off by the test mode signal of the VPP amplitude, are connected in parallel. The NMOS transistor NM3 may, however, be dispensed with. Alternatively, the test mode signal of the amplitude equal to VDD may be entered to the gate of the NMOS transistor NM3 in place of the test mode signal of the amplitude equal to VPP. Still alternatively, (VDD+VKK) may be output instead of (VDD+VKK)/2, as the level-converted voltage.

The circuit configuration of the above-described selection circuits 100 to 103 is merely illustrative and, of course, the configuration of the switches and level converter circuit of the selection circuit of the present invention is not limited to the above-described configuration.

In the above-described example, it is possible to measure the power supply voltage during data read and data write operations. The output buffer of the I/O buffer is set to a disabled state in advance by EMR setting by the EMR command, as described above, such that data read out from the selected memory cell reaches an input of the output buffer, but is not output to the DQ pad. At this time, the internal power supply voltage is output by the selection circuits 100 to 103 at the DQ pad. However, no data is output. Although no read data is output to the DQ pad, the read operation is carried out within the device, so that the internal power supply voltage during the read operation is output at the DQ pad.

During the write operation, the internal power supply voltage is output, as a voltage within the range of the power supply voltage VDD-VSS, from the selection circuits 100 to 103 to the DQ pad. This output voltage is applied as write data to the input buffer of the I/O buffer. At this time, the DQ pads are changed over to the internal power supply voltage output, such that no write data from the prober can be delivered thereto. However, the write operation is carried out within the device with the DQ pad voltage as write data. Hence, the internal power supply voltage in the write state is output at the DQ pad.

Figure 6:
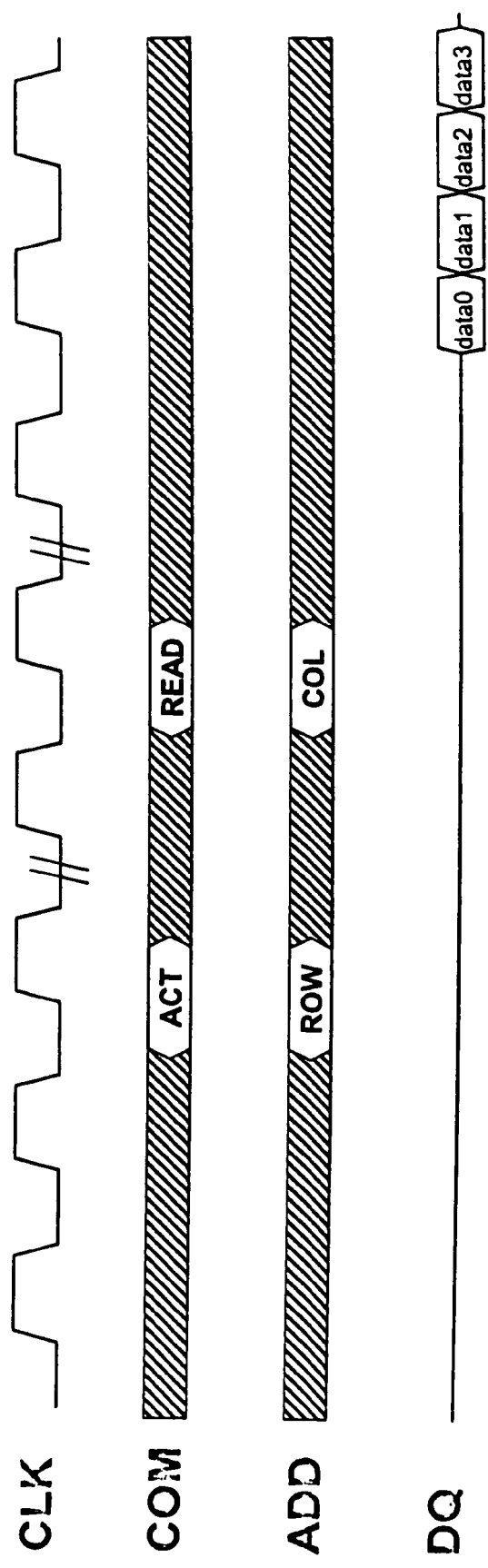
FIG. 6 is a timing diagram for illustrating the operation of the example of the present invention.

FIG. 6 depicts a waveform diagram showing the operating waveform during read time in the course of the normal operation of the device. As command (COM), ACT (bank active) is entered, at the same time as the row address is entered. A column address is entered by a READ command, and read data data0, data1, data2 and data3 are output with a burst length equal to 4. During the normal operation, the selection circuits 100 to 103 of FIG. 2 are set to an off-state. The output terminals of the output buffer that output read data are connected to relevant DQ pads directly, that is, without the intermediary of a switch or the like. Hence, there is no risk of deteriorating a signal characteristic of the data signals output to the DQ pads.

Figure 7:
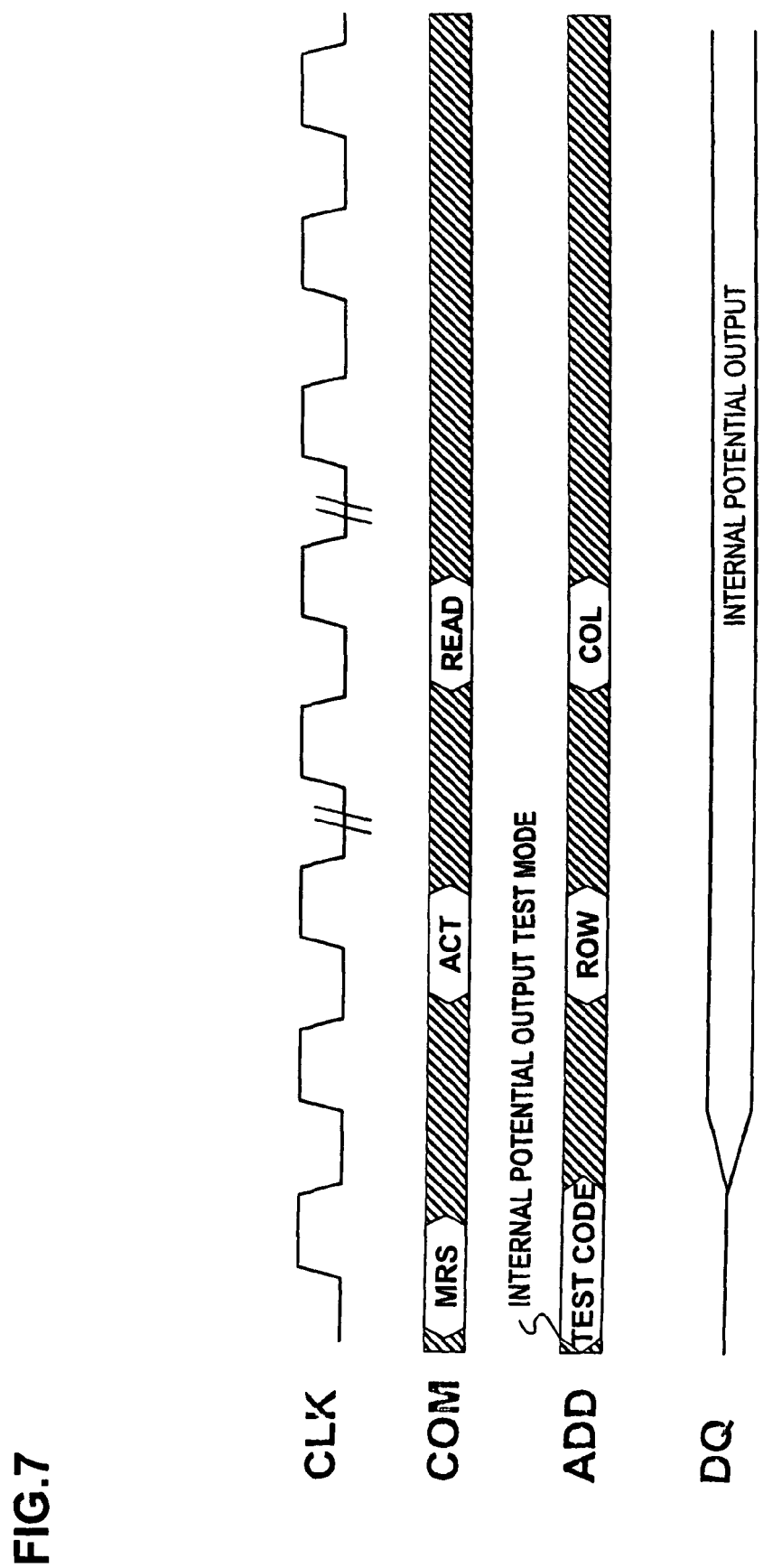
FIG. 7 is another timing diagram for illustrating the operation of an example of the present invention.

FIG. 7 depicts a waveform diagram showing the operating waveform during the time of activation of the test mode signal (internal power supply voltage enable signal). The MRS (Mode Register Set) command is entered, while a test code is entered to address terminals A0 to A13. In this case, the test mode signal is the internal power supply output enable signal. The selection circuits 100 to 103 output the internal power supply voltage to the DQ pads. Within the device, the read data which has been read from the selected memory cell by the ACT (bank active) command and by the READ command is transferred to the output buffer. However, the output buffer is in the disabled state, so that no read data is output to the DQ pads. The internal power supply voltage is output at the DQ pads (DQ pads DQ0 to DQ3). The disabled state of the output buffer is set by the writing of the EMR (Extended Mode Register) by the EMRS command, as described above. In the EMRS command, the address A12 is set to 1. In the example of FIG. 7, the EMRS command is executed before the MRS command, though not in a limiting way. In the present example, the internal power supply voltage is output from the data terminals DQ (DQ0 to DQ3) during the read operation of the device, so that a plurality of internal power supply voltages may be measured simultaneously.

In the above example, the different power supply voltages of a plurality of devices are measured in parallel simultaneously to shorten the test time. It is however possible to select one of a plurality of power supply voltages, output by a plurality of the internal power supply generating circuits, by a selection circuit, depending on the number of the internal power supply voltages in the device, and to output the so selected voltage at the sole data terminal by time divisional outputting. For example, if the number of the internal power supply voltages in the subject being monitored is six and the number of the DQ pads is four, one of the first and second internal power supply voltages may be output at the DQ pad DQ0, one of the third and fourth internal power supply voltages at the DQ pad DQ1 and the fifth and sixth internal power supply voltages at the DQ pads DQ2 and DQ3.

An example in which the present invention is applied to testing at the wafer manufacturing step (inspection of device characteristics) has been described above. However, it is as a matter of course possible to apply the present invention to measurement of the internal power supply voltages in the parallel testing in the course of the inspection process following the assembling process. Although the present invention has been described above with reference to an example in which the internal power supply monitor terminals are in common use with the DQ pads, which are I/O (input/output) terminals, such a configuration is as a matter of course possible in which the internal power supply monitor terminals are in common use with the signal output terminals.

The disclosures of the aforementioned Patent Documents are incorporated by reference herein. The particular exemplary embodiments or examples may be modified or adjusted within the gamut of the entire disclosure of the present invention, inclusive of claims, based on the fundamental technical concept of the invention. Further, variegated combinations or selection of elements disclosed herein may be made within the framework of the claims. That is, the present invention may encompass various modifications or corrections that may occur to those skilled in the art in accordance with the within the gamut of the entire disclosure of the present invention, inclusive of claim and the technical concept of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
   an internal power supply generating circuit that generates an internal power supply voltage;
   a signal terminal, via which a signal is output or a signal is input and output, the signal terminal being in common use with a terminal for monitoring the internal power supply voltage;
   a selection circuit that selects whether the internal power supply voltage from the internal power supply generating circuit is to be output from the signal terminal, in accordance with a test control signal supplied thereto; and a mode register storing information for controlling an operation mode of the semiconductor device, the test control signal being generated based on a value set in the mode register.

2. The semiconductor device according to claim 1, further comprising a plurality of sets, each set including the internal power supply generating circuit and the signal terminal associated with the internal power supply generating circuit,
a plurality of the selection circuits being provided between a plurality of the internal power supply generating circuits and a plurality of the signal terminals, so that each selection circuit is associated with one of the internal power supply generating circuits and with one of the signal terminals associated with the one internal power supply generating circuit.

3. The semiconductor device according to claim 1, wherein, when the internal power supply voltage from the internal power supply generating circuit is output from the signal terminal, the selection circuit associated with the internal power supply generating circuit that generates an internal power supply voltage higher than an upper limit or lower than a lower limit of the amplitude of the signal output from the signal terminal performs level-conversion of the internal power supply voltage output from the internal power supply generating circuit and delivers the resulting voltage to the signal terminal.

4. The semiconductor device according to claim 1, wherein, when the internal power supply voltage from the internal power supply generating circuit is output from the signal terminal, the selection circuit associated with the internal power supply generating circuit that generates an internal power supply voltage within an amplitude range of the signal output from the signal terminal, delivers the internal power supply voltage output from the internal power supply generating circuit, in an unchanged state, to the signal terminal.

5. The semiconductor device according to claim 1, wherein, when the internal power supply voltage from the internal power supply generating circuit is output from the signal terminal, an output buffer for outputting a signal to the signal terminal is set to an inactivated state.

6. The semiconductor device according to claim 1, wherein the signal terminal is a data terminal via which data is output or data is input and output.

7. The semiconductor device according to claim 1, wherein the internal power supply generating circuit comprises a plurality of internal power supply generating circuits, the signal terminal comprises a plurality of signal terminals, and the selection circuit comprises a plurality of selection circuits,
wherein the plurality of selection circuits are connected between the plurality of internal power supply generating circuits and the plurality of signal terminals, respectively, and
wherein the test control signal is supplied in common to the plurality of selection circuits.

8. The semiconductor device according to claim 7, further comprising:
an input/output buffer for inputting and outputting data signals, the plurality of selection circuits being connected between the plurality of signal terminals and the input/output buffer; and
a plurality of signal terminals which are connected to the input/output buffer and which are dedicated to output of a signal or input and output of a signal.

9. The semiconductor device according to claim 8, further comprising:
control logic which produces the test control signal based on the value set in the mode register.

10. The semiconductor device according to claim 9, wherein when the internal power supply voltage from the internal power supply generating circuit is output from the signal terminal, the input/output buffer is set to an inactivated state by writing output buffer disable information in the mode register.

11. The semiconductor device according to claim 1, wherein the plurality of internal power supply generating circuits outputs a plurality of internal power supply voltages in parallel to the plurality of signal terminals.

12. The semiconductor device according to claim 1, further comprising:
a control circuit for receiving address signals and control signals;
a plurality of address signal terminals which are connected to the control circuit; and
a plurality of command signal terminals which are connected to the control circuit.

13. The semiconductor device according to claim 1, wherein the selection circuit converts the internal power supply voltage to an other voltage and outputs the other voltage from the signal terminal.

14. The semiconductor device according to claim 1, wherein the selection circuit comprises an input protection circuit for protecting the internal power supply generating circuit against an input voltage from the signal terminal.

15. A method for testing a semiconductor device in which a terminal for monitoring an internal power supply is in common use with a signal terminal, via which a signal is output or a signal is input and output, and in which it is selected whether an internal power supply voltage is to be output from the signal terminal, in response to a test control signal, the method comprising:
setting the test control signal of the semiconductor device to a mode of outputting the internal power supply voltage from the signal terminal; and
measuring the internal power supply voltage output from the signal terminal of the semiconductor device,
wherein the semiconductor device includes a mode register storing information for controlling an operation mode of the semiconductor device, the test control signal being generated based on a value set in the mode register.

16. The method according to claim 15, wherein the semiconductor device includes a memory, the method further comprising:
providing a common address and a common command to a plurality of the semiconductor devices under test in parallel;
acquiring output signals of the plurality of semiconductor devices under test in parallel; and
in the mode of outputting the internal power supply voltage set by the test control signal, measuring the respective internal power supply voltages of the plurality of the semiconductor devices under test in parallel, the internal power supply voltages being output in parallel from a plurality of the signal terminals of the plurality of the semiconductor devices under test.

17. The method according to claim 15, further comprising in the mode of outputting the internal power supply voltage, the semiconductor device performing level-conversion of the internal power supply voltage, in case the internal power supply voltage is higher than an upper limit or lower than a lower limit of the amplitude of the signal output from the signal terminal; and
the semiconductor device delivering the internal power supply voltage thus level-converted to the signal terminal.

18. The method according to claim 15, further comprising in the mode of outputting the internal power supply voltage, the semiconductor device delivering the internal power supply voltage in an unchanged state to the signal terminal, in case the internal power supply voltage is within an amplitude range of the signal output from the signal terminal.

19. The method according to claim 15, further comprising:

setting an output buffer that outputs a signal to the signal terminal to an inactivated state, when the internal power supply voltage is output from the signal terminal.

20. A semiconductor device comprising:

a plurality of internal power supply generating circuits that generate a plurality of internal power supply voltages, respectively;

a plurality of signal terminals which are commonly used for monitoring the plurality of internal power supply voltages, respectively, and inputting a signal or inputting and outputting a signal;

a plurality of selection circuits that are connected between the plurality of internal power supply generating circuits and the plurality of signal terminals, and select whether the plurality of internal power supply voltages are to be output from the plurality of signal terminals, in accordance with a test control signal supplied in common to the plurality of selection circuits; and a mode register storing information for controlling an operation mode of the semiconductor device, the test control signal being generated based on a value set in the mode register.

* * * * *